US006559103B1

(12) United States Patent
Kirkwood et al.

(10) Patent No.: US 6,559,103 B1
(45) Date of Patent: May 6, 2003

(54) METHOD FOR PRODUCING SUPERCONDUCTING OXIDE COMPOUNDS

(75) Inventors: Brad Lee Kirkwood, Kent, WA (US); Thomas S. Luhman, Bellevue, WA (US); Ronald Roy Stephenson, Kirkland, WA (US); Michael Strasik, Renton, WA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 07/325,269

(22) Filed: Mar. 17, 1989

Related U.S. Application Data

(63) Continuation-in-part of application No. 07/155,358, filed on Feb. 12, 1988, now abandoned.

(51) Int. Cl.$^7$ .......................... H01L 39/12; C04B 35/624
(52) U.S. Cl. ...................... 505/430; 264/621; 264/622; 264/623; 501/12; 505/440; 505/450; 505/510; 505/735; 505/737; 505/739; 505/740; 505/741; 505/779; 505/780; 516/88; 516/89
(58) Field of Search .................... 264/56, 621, 622, 264/623; 505/1, 735, 779, 780, 440, 550, 430, 737, 739, 740, 741, 510; 501/12; 516/88, 89

(56) References Cited

U.S. PATENT DOCUMENTS

| | | | |
|---|---|---|---|
| 3,330,697 A | | 7/1967 | Pechini |
| 3,640,093 A | | 2/1972 | Levene |
| 3,702,279 A | * | 11/1972 | Ardary |
| 4,614,673 A | | 9/1986 | Bendig |
| 4,693,865 A | | 9/1987 | Goto |
| 4,764,357 A | | 8/1988 | Sherif et al. ............... 423/338 |
| 4,801,399 A | * | 1/1989 | Clarke ........................ 501/12 |
| 4,804,649 A | | 2/1989 | Sherif ........................... 505/1 |
| 4,851,150 A | * | 7/1989 | Hench, I ..................... 501/12 |
| 4,851,373 A | * | 7/1989 | Hench, II .................... 501/12 |
| 4,861,753 A | * | 8/1989 | McCarron ..................... 505/1 |
| 4,880,770 A | | 11/1989 | Mir et al. |
| 4,880,771 A | | 11/1989 | Cava et al. |
| 4,880,772 A | | 11/1989 | Pederson et al. |
| 4,880,773 A | | 11/1989 | Itozaki et al. |
| 4,882,304 A | * | 11/1989 | Novich et al. |
| 4,892,862 A | | 1/1990 | Ogushi |
| 4,981,840 A | * | 1/1991 | Brown et al. |
| 4,999,336 A | * | 3/1991 | Nadkarni et al. |
| 5,075,282 A | * | 12/1991 | Koinuma et al. |
| 5,091,221 A | * | 2/1992 | Chu et al. |
| 5,202,306 A | * | 4/1993 | Goretta et al. |

FOREIGN PATENT DOCUMENTS

| | | | |
|---|---|---|---|
| EP | 0248432 | * | 12/1987 |
| EP | 0296380 | * | 12/1988 |
| JP | 63248022 | | 4/1987 |
| JP | 1131025 | | 11/1987 |
| JP | 1242406 | * | 3/1988 |
| JP | 3248022 A | | 10/1988 |
| JP | 63257131 | * | 10/1988 |
| JP | 1131025 A | | 5/1989 |

OTHER PUBLICATIONS

Bednorz et al. (Ref.No. [171]), "Phase Diagram of the $(LaAlO_3)_{1-x}(SrTiO_3)_x$ Solid–Solution System, For $x<0.8$," Mat. Res. Bull., 84, pp. 181–187 (1983).*

Bednorz et al. (Bednorz), "Possible High $T_c$ Superconductivity in the Ba–La–Cu–O System," Z. Phys. B–Condensed Matter, 64, pp. 189–193 (1986).*

Chu et al. (Chu), "Evidence for Superconductivity above 40 K in the La–Ba–Cu–O Compound System," Phys. Rev. Letters, 58(4), pp. 405–407 (Jan. 26, 1987).*

Wu et al. (Wu), "Superconductivity at 93 K in a New Mixed–Phase Y–Ba–Cu–O Compound System at Ambient Pressure," Phys. Rev. Letters, 58(9), pp. 908–910 (Mar. 2, 1987).*

Advanced Ceramic Materials, vol. 2, No. 3B, Jul. 1987, pp539–554 Behrman Synthesis, Characterization, and Fabrication of High Temperature Superconducting Oxides.*

Hor et al, High–Pressure Study of the New Y–Ba–Cu–O Superconducting Compound System, In Physical Review Letters, vol. 58, No. 9, pp 911–912, Mar. 2, 1987.*

Mukherjee, Sol–Gel, Process in Glass Science and Technology, J. Non–Crystalline Solids 42(1980) 477–488.*

Trolier et al, Dissolution of $YBa_2Cu_3O_{(7-x)}$ in Various Solvents Ceramic Bull. vol. 67, No. 4, 1988, 759–762.*

Johnson et al, Fabrication of Ceramic Articles from High $T_c$ Superconducting Oxides, Extend Abstracts, High Temp. Superconductors, Proc. of Syn (1987, Spring(Meeting, Mat'ls Res. Soc. 193–195.*

Nies et al, Glass–Bonded Composites Containing Superconducting $YBa_2Cu_3O_{9-y}$ for Levitation & Magnetic Shielding Applications, Mat. Res. Bull, vol. 23, 1988, 623–630.*

Qiu et al, Some Properties of Bulk Y–Ba–Cu–O Compounds Containing $SiO_2$, J. Appl. Phys. vol 64, No. 4, Aug. 15, 1988.*

Koinuma et al, High Tc Superconductivity in Screen Print of $Ub–BaC_4O$ Films, Jap. J. of App. Phys. vol. 26, No. 5, May 1987, pp<761–>762.*

Barboux, et al., "The Preparation of Bulk and Thick Films of $YBa_2 Cu_3 O_{7-y}$ using a Solution Technique", Materials Research Society Symposium Proceedings, vol. 99, Brodsky, M.B., et al, ed., pp. 49–55.

Erov, et al., Proc. of Materials Research Society, *Better Ceramics Through Chemistry*, C.G. Brinker, et al. (eds) 1986 "Polymeric Precursors Synthesis of Ceramic Materials".

(List continued on next page.)

*Primary Examiner*—James Derrington
(74) *Attorney, Agent, or Firm*—John C. Hammar

(57) ABSTRACT

A process is provided for preparing solid superconducting mixed-metal oxides whereby the superconductor can be formed into any predetermined shape by way of viscous sol precursors. The superconductors are also formed by this process into homogeneous phases.

19 Claims, No Drawings

OTHER PUBLICATIONS

Pope et al., "Organo–Metallic Polymer Route to Superconducting Ceramics: Chemistry and Fabrication of Wires and Coatings", *High Temperature Superconductors II* C D. Capone, et al., (eds.), Apr. 5–8, 1988, p. 97.

Wang, et al., 26 Inorganic Chem. 1474 (1987).

Liu, et al., 99 *Matl. Res. Soc. Symposium Proceedings* 253 (Nov. 30–Dec. 4, 1987).

Chiang, et al., 99 Matl. Res. Soc. Symp. Proceedings 307 (Nov. 30–Dec. 4, 1987).

Yurek, et al., 2. Electrochem. Soc., 134 (10) 2634 (Oct. 1987).

Uchikawa, et al., High–Temperature Conductors II (D. Capone, et al. eds.), Apr. 5–8, 1988, p. 89.

\* cited by examiner

METHOD FOR PRODUCING SUPERCONDUCTING OXIDE COMPOUNDS

This is a continuation-in-part of Ser. No. 07/155,358, filed Feb. 12, 1988 now abandoned.

The present invention is directed to a method for producing superconducting oxide compounds which are formable into fibers and other desired shapes. The present invention is also directed to an improved method for making superconducting oxide compounds with advantageous homogeneity and current-carrying capacity.

BACKGROUND OF THE INVENTION

Until recently, known superconducting materials have been metallic materials which exhibit superconducting properties only at temperatures close to absolute zero. However, recently a novel class of superconducting materials which take the form of ceramics, or mixed metal oxides, have been discovered, some of which exhibit superconductivity above the temperature of liquid nitrogen, 77° K. (−321° F.), at ambient pressure, which signifies the ability to prepare and maintain superconductive materials now in virtually any laboratory. These mixed metal oxides are made typically by sputtering the appropriate metals and metal oxides onto a substrate and sintering to form the requisite ceramic structure. Another method involves coprecipitating the appropriate metals from aqueous solutions of their nitrate salts, then heating the precipitate at 900° C. to 950° C. to form the appropriate ceramic structure.

One of the disadvantages of the sintering method is that it produces islands of the correct compound composition for superconductivity, interconnected by areas where the stoichiometry is not optimized for superconductivity. This problem of nonhomogeneity may partially account for the low current-carrying characteristics of the mixed metal oxide superconductors. If these superconducting materials are to have a broad base industrial application, methods need to be devised to increase their current carrying capacity.

Another problem is that the ceramic material is brittle, hard and difficult to handle without damaging the ceramic, and is particularly difficult to form into a wire or fiber, which is useful for high-current applications.

For small-scale applications, such as for use as components in electronic devices, the low current-carrying capacity problem may be solved by fabricating the ceramic materials in the form of single crystals. However, the technology for making large single crystals suitable for high-current industrial uses is not practically available.

It is therefore an object of the present invention to provide a method for producing mixed metal oxide superconducting materials which can be made into virtually any desired shape or form and which, in particular, may be cast or extruded.

It is another object of the present invention to provide a method for making mixed metal oxide superconductors characterized by advantageous homogeneity.

It is a further object of the present invention to provide a method for making mixed metal oxide superconductors whereby precise dopant concentration can be tailored to create optimum oxide charge states in the superconductor.

It is yet another object of the present invention to provide novel mixed metal oxide superconductors according to the processes disclosed hereinafter.

These and other objects of the present invention will be apparent from the following description of the preferred embodiments of the invention, the appended claims, and may from the practice of the invention.

SUMMARY OF THE INVENTION

The present invention provides a method for preparing solid superconducting mixed-metal oxides in a predetermined shape and form, comprising the steps of providing a solution of salts of the metals contained in the desired superconducting mixed-metal oxide of predetermined composition, wherein each of the salts is present in an amount necessary to provide the predetermined stoichiometric amount of each respective metal required in the desired superconductive mixed-metal oxide; and wherein the counterions, or hydrolysis products thereof, of the metal ions for each of the salts in the solution are removable from the solution by evaporative methods; subjecting the solution to hydrolyzing conditions and removing the counterions and/or hydrolysis products thereof, and a substantial portion of the solvent, from the solution by evaporative methods; converting the metal ions to a mixed metal oxide precursor of the superconducting mixed metal oxide; peptizing the mixed metal oxide precursor to form a viscous polymeric sol; forming the viscous polymeric sol into a predetermined shape or form and heat-setting the sol to a flexible, ductile gel; firing the heat-set gel in the presence of oxygen at a temperature and for a period of time sufficient to oxidize and volatilize any remaining vapors and organic materials from the gel and to form the solid superconducting mixed metal oxide. Novel superconducting mixed metal oxides according to the present invention are also provided, as well as novel viscous, castable, extrudable mixed metal oxide precursors.

DESCRIPTION OF THE PREFERRED EMBODIMENTS

The present invention provides a method for producing mixed metal oxide superconducting materials of a predetermined shape, such as tape, fibers, and coatings. In the context of the description of the invention the term sol will have its accepted technical meaning: a colloidal solution. The term gel will have its accepted technical meaning: a colloidal solution of a liquid in a solid. The starting materials for the method are soluble salts, in particular the soluble organic salts, of the metals which comprise the final mixed metal oxide superconductor. The metal salts may be soluble in water, or water miscible alcohol, mixtures thereof, or any other water-miscible solvent which can be removed by evaporation without a reaction which is deleterious to the formation of the desired mixed metal oxide structure. If an appropriate soluble salt of a desired metal is not readily available, but is available as an insoluble metal halide, the metal may be incorporated, alternatively, as a colloidal gel by reacting the metal halide (such as a metal chloride) with water to make a colloidal metal hydroxide. Such a colloidal metal hydroxide may be separated from an ammonium chloride solution, then reacted with the sol containing hydroxides and/or oxides of the other metals to be incorporated into the mixed oxide superconductor.

While not intending to be limited by any particular theory, it is believed that the method of preparation of the mixed metal oxides of the present invention permit the formation of the appropriate metal oxide structure to occur on a colloidal level among particles the size of about 1–10 nm in diameter in the proper stoichiometry and lattice conformation, valence ratio and phase relationships, thereby producing compounds which are believed to be more homogeneous than a mixed metal oxide superconductor of similar composition made by sputtering and sintering of mixed-metal oxide or carbonate powders. Sputtering of metal oxide or carbonate powders allows mixing of particles on the order of 1–10 µm in size, which are sintered more slowly than the colloidal particles according to the method of the present invention.

A solution is first prepared containing soluble salts of the metals ultimately required in the mixed metal oxide superconductor. These salts are preferably soluble in water or in a water-miscible alcohol, such as methanol, ethanol, isopropanol, ethylene glycol and the like. The appropriate salts include those which provide, as a counterion to the metal ion, an ion which is removable by evaporative methods, or at least the hydrolysis product of which is removable by evaporative methods. This thus includes the organic counterions such as the acetates and formates, as well as counterions which evolve as gases at an appropriate pH, such as the carbonates. To assist in solubilizing the metal salts, polyhydroxy compounds, such as, ethylene glycol, and organic acids, such as citric acid, malonic acid, acetic acid, and the like, may be added to form the metal salt solution. These polyhydroxy compounds and organic acids retain metal salts in solution, since some salts would precipitate under subsequent distillation conditions. Exemplary salts of those metals which comprise mixed metal oxide superconductors include, but are not limited to:

|  | Soluble in |
| --- | --- |
| lanthanum carbonate | water (acid pH); EG/CA |
| barium acetate | water |
| yttrium acetate | water |
| erbium acetate | water |
| cupric carbonate | water |
| cupric hydroxide | water |
| cupric formate | water |
| lanthanum acetate | water |
| strontium formate | water |
| barium carbonate | EG/CA |
| gadolinium carbonate | EG/CA |

EG/CA = ethylene glycol and citric acid

It is contemplated that in some instances an appropriate soluble salt of a desired metal may not be readily available. In such cases an available insoluble metal halide, such as the metal chloride, may be used to prepare a colloidal metal hydroxide which, in turn, may be later added to the peptized hydroxide sol containing the other metals required for the making of the mixed oxide superconductor. For example, a metal chloride may be reacted with water to form a colloidal metal hydroxide. The colloidal metal hydroxide may be separated from an ammonium chloride solution and then added to the sol containing the other hydroxides or oxides of the other metals. Exemplary halide salts which may be utilized in this manner include, but are not limited to:

barium chloride barium fluoride strontium fluoride strontium iodide strontium bromide lanthanum chloride gadolinium fluoride erbium iodide scandium iodide dysprosium iodide proseodymium chloride After preparation of the solution of soluble metal salts, if water is not already present in the solution, water is then added and the solution is subjected to hydrolyzing conditions whereby the counterions of the metal ions, or their hydrolysis products, are converted to moieties which are removable, by evaporative methods, such as by evolution of gas, or by evaporation of alcohols or organic acid. This may normally be done by distillation whereby the organic products are removed from the metals along with a substantial portion of the organic solvent and water. Subsequent to or simultaneous with distillation, the metals are converted by heating to oxides to form a mixed metal oxide precursor for the superconductor material.

The mixed metal oxide precursor, which is then typically a homogeneous semi-solid, is peptized to a sol, or fluid colloidal system, usually by addition of a strong mineral or organic acid, such as concentrated nitric acid, hydrochloric acid, lactic acid, and the like. This peptization step is usually conducted by heating at a temperature of less than about 100° C. At this time, metal colloidal gel, prepared by reacting metal halide and water, may be added to provide the metal or metals for which there were no available soluble salts. During this peptization process, the polymeric chains of the inorganic oxides are then formed.

Heating this sol produces a thick, viscous gel which can then be cast into thin strips, extruded, or drawn, as continuous or discontinuous fibers, into thin monofilamentary fibers or multifilamentary tows. The gel can also be diluted and sprayed as a chemically homogeneous coating, for example, on a resonance cavity of a particle accelerator. Upon forming the gel into its desired form either as continuous fibers, discontinuous fibers, tape, coating, or otherwise, the gel is heat-set, usually by contact with a hot flowing air environment, typically at about 80–120° C. The resultant hard-gelled mixed-metal oxide is ductile, flexible and handleable, and thus is an improvement over products made by the sintered powder method.

As a final step, the mixed metal oxide in its desired hard-gelled shape, is fired at a temperature and for a period of time sufficient to oxidize and volatilize any remaining vapors and organic materials, thereby leaving an intact, dense, mixed metal oxide ceramic superconductor in its desired superconducting form. While this period of time will vary, usually one to six hours will suffice. Usually, the firing temperature will be in the range of about 900–1100° C. The preferred firing temperatures are in the range of 900–1000° C., most preferably at about 950° C.

Although not required, in some instances it is desirable to provide a final high-pressure (1 atm. or greater) oxygen heat treatment at a temperature of about 1000–1100° C. to partially compensate the p-type semiconductor mixed metal oxide through a slight oxygen deficiency on the oxygen sublattice. Such a high-pressure oxygen firing would be desirable, for instance, to make sensitive components for solid state electronic devices.

The final mixed metal oxide superconductors produced according to the present invention include, but are not limited to, those having the formula $A_2GCu_3O_{7-x}$, wherein A is any Group II metal, with barium and strontium being preferred; and G is any Group III metal or lanthanide, with lanthanum and yttrium being the preferred Group III metals and gadolinium and erbium being the preferred lanthanides. In the aforementioned formula, x may vary from about 2 to 3. Another metal oxide superconductor, when yttrium is present, is represented by the formula of $[Y_{1-x}Ba_x]_2CuO_{4-d}$, wherein d is zero or any positive number less than 4 and x is zero or any positive number less than 1. Particularly preferred mixed metal superconductors are those which are the mixed metal oxides of yttrium-barium-copper and gadolinium-barium-copper since these have been reported to exhibit superconducting properties above the temperature of liquid nitrogen at atmospheric pressure. It will, of course, be appreciated that the superconducting properties of mixed metal oxides depend at least in part on various lattice parameters (packing, atomic sizes, etc.), the valence ratios among the atomic metal components and the phase interrelationships present in the structure. To the extent that these can be controlled by using precise amounts of the various metals forming the oxide, the present invention is an improvement over the sputtering method. Moreover, the precise dopant level concentrations of any particular metal can be exactly tailored so that the precise oxide charge state may be produced to optimize the superconducting properties. Such precision and control in formulating a superconductor is not available on a predictable basis by the sputtering process.

By virtue of their improved homogeneity, it is also believed that the superconductor products made according to the present invention are novel and advantageous as compared to the prior art high-temperature mixed metal oxide superconductors which are made by sputtering and sintered powder methods.

Having described the preferred embodiments, the following examples are present by way of illustration, but are not intended to limit the invention in any way.

EXAMPLE 1

The sample of 20 g of lanthanum carbonate [$La_2(CO_3)_3$] was dispersed in hot water and 2 ml of concentrated nitric acid to bring the pH to 5.5. The solution was refluxed for one hour and then 14.9 g of copper formate [$Cu(HCO_2)_2$] and 1.555 g of strontium formate [$Sr(HCO_2)_2$] were added. The pH was lowered to 4.5–5.0 and carbon dioxide evolved. After evolution of carbon dioxide ceased, the resulting gel had a pH of 4.5 and was then refluxed for 8 hours at 90° C. to polymerize the hydroxides. This mixed metal oxide precursor gel may then be peptized and formed into fibers, ribbons, tapes or sprayed as a coating.

EXAMPLE 2

An aqueous solution was formed by adding 23.16 g of copper formate, 25.69 g of barium acetate and 17.26 g of lanthanum acetate [$La(CH_3CO_2)_3 \cdot 1.5H_2O$] to water and heating. Colloids appeared after initial dissolution and the sol had a semi-cloudy appearance during the first distillation at 85° C. The sol was then diluted to 1000 ml after the first distillation to drive off the hydrolysis products of the acetates and formates. Then 5 ml of lactic acid were added to buffer the sol and to begin peptization. The solution was refluxed for 46 hours after which the solution returned to the sky blue color. Three further distillations of approximately 600 mls left a sky blue colloidal liquid. To this liquid 3.5 ml of concentrated nitric acid was added and 50 ml of water in 200 mls of solution. This mixture was refluxed at 93° to peptize the colloids to a sol for 22 hours. Redilution of the solution with 400 mls of water dissolved the precipitate and distillation once again produced a gelatinous sol. This sol was distilled to a high weight solids content and the sol was viscous enough to draw rod-like fibers from it with a stick. This sol could be extruded to fine-diameter fibers or cast into a flat tape. The drawn fibers were allowed to gel overnight and then placed in a 140–260° F. blowing air drying oven to further remove water vapor. The fibers were semi-rubberlike and could be handled without breakage as they were transferred to a firing plate and placed in a furnace where they were fired in air at the following schedule: 30 minutes ramp from room temperature to 120° C.; 1 hour at 120° C.; 4 hour ramp to 400° C.; 1 hour at 400° C.; 5 hour downward ramp to 200° C.; then cooled to room temperature. It is believed that the 120° C. plateau is a bakeout to remove remaining water vapor and the 4 hour ramp to 900° burns off the remaining acetates and formates and converts the hydroxides to oxides. The 900° plateau sinters the structure to a dense ceramic and the slow cool from 900° effects the oxygen deficiency to produce the better superconducting properties. In some instances a longer sintering at 900° or higher may be desirable to obtain more surface uniformity. This may be accomplished by prolonging the 900° plateau from 1 hour to approximately 3–4 hours.

EXAMPLE 3

A mixture of 7.3 g of yttrium triacetate, 13.57 g of barium diacetate and 9.07 g of $CuCO_3 \cdot Cu(OH)_2$ were dissolved in a mixture of 36.51 g of water and 61.32 g of ethylene glycol with heat. The mixture was refluxed and cooled overnight to form a green granular crystalline solid. Upon addition of about 100 mls of distilled water and additional solvent mixture, the product was heated to near the boiling point and the solid redissolved to a form a dark green solution. After cooling overnight, a viscous block was formed with an unmixed brown phase which upon stirring and reheating became homogeneous. The mixture was calcined in a muffle furnace at about 1500° F. for 1 hour then cooled. The solid was divided into separate beakers and placed on hot plates until they became powdery, fluffy and easy to crush. About one-half of each sample was crushed and placed on a prebaked out alumina crucible in a muffle furnace and heated from 12°–900° over a 3 hour period, then from 900°–950° for 12 hours, held at 950° for four hours, then cooled to 450° over 2½ hours, held at 450° for 6 hours, then cooled over 9 hours to 18°.

EXAMPLE 4

A mixture of 3.28 g of erbium triacetate tetrahydrate, 4.03 g of barium diacetate and 2.69 g of $CuCO_3 \cdot Cu(OH)_2$ were combined and dissolved in about 5 mls concentrated nitric acid, water and ethylene glycol and heated until dissolved. The mixture was then stripped of solvent at about 100° C. for 20 hours, and upon cooling became a clear bluish gel of toothpaste consistency with a light blue powder on the surface. When cooled it became dark blue then dark olive green and upon reheating to 228° the mixture thickened. The mixture was redissolved in water, the water was stripped and a viscous material was formed and was cured as described above in Example 3.

EXAMPLE 5

A sol is prepared in accordance with Example 2, except that an equivalent amount of yttrium acetate is used in place of lanthanum acetate. Prior to exposure to the drying oven at 140–260° F. the sol is drawn into fibers and allowed to gel overnight, then cured as described above in Example 3. The nominal composition is represented by the formula $Ba_2YCu_3O_9$.

EXAMPLE 6

A solution of 0.4 mole of glucose and 0.8 mole of lactic acid in distilled water (300 g solution) is made and to 74 g of the solution is added 0.1 mole of yttrium triacetate. In a second container with 136 g solution, 0.2 mole of barium diacetate is added. In a third container with 90 g solution, 0.3 mole of copper carbonate is added. Each mixture is separately heated and stirred to remove water until the viscosity is as high as possible without inducing crystallization. The ingredients are combined in a flask and each container is rinsed to quantitatively transfer any remaining material.

Enough water is added to facilitate stirring. The slurry is heated to near reflux while stirring. Water is removed by distillation until the mixture becomes viscous and homogeneous. This procedure is repeated by adding more water and heating until the distillate reaches a pH greater than 5. Water is removed until the viscosity reaches the desired consistency for extrusion, painting, casting and the like. Excess water is slowly removed to gel the product, then the product is cured as described in Example 3.

Having described the preferred embodiments above of the invention, other modifications and alternative embodiments will be apparent which will be within the spirit and scope of the present invention. The invention is not intended to be limited except by the scope of the following claims.

We claim:

1. A method for preparing a solid superconducting mixed-metal oxide in a predetermined shape and form, comprising the steps of:
   (a) providing a solution of salts of metals contained in said superconducting mixed metal oxide of a predetermined composition, each of said salts being present in an amount necessary to provide the respective predetermined stoichiometric amount of a metal required in said superconductive mixed metal oxide; the counterions of each metal ion, or the hydrolysis products of said counterions, in said solution of salts being removable from said solution by evaporative methods;
   (b) subjecting said solution to hydrolyzing conditions and removing said counterions and hydrolysis products thereof from said solution by evaporative methods with a substantial portion of the solvent;
   (c) converting said metal ions to a mixed-metal oxide precursor of said superconducting mixed-metal oxide;
   (d) peptizing said mixed-metal oxide precursor to form a viscous polymeric sol;
   (e) forming said viscous polymeric sol into a predetermined shape and form and heat-setting said sol into a flexible, ductile, handleable gel;
   (f) firing said gel in the presence of oxygen at a temperature and for a period of time sufficient to volatilize any remaining vapors and organic materials to form said solid superconducting mixed metal oxide.

2. A method of preparing a castable, extrudable, viscous polymeric sol to a superconducting mixed-metal oxide comprising the steps of:
   (a) providing a solution of salts of metals contained in said superconducting mixed metal oxide of a predetermined composition, each of said salts being present in an amount necessary to provide the predetermined stoichiometric amount of a metal required in said superconductive mixed metal oxide; the counterions of each metal ion, or the hydrolysis products of said counterions, in said solution of salts being removable from said solution by evaporative methods;
   (b) subjecting said solution to hydrolyzing conditions and removing said counterions and hydrolysis products thereof from said solution by evaporative methods with a substantial portion of the solvent;
   (c) converting said metal ions to a mixed-metal oxide precursor of said superconducting mixed-metal oxide;
   (d) peptizing said mixed-metal oxide precursor to form said viscous polymeric sol.

3. A castable, extrudable, viscous mixed-metal polymeric sol produced according to the method of claim 2.

4. A method according to claim 1 wherein said metal salts of said metals are selected from the group consisting of organic salts.

5. A method according to claim 1 wherein said metals are selected from the group consisting of copper, and metals of Group II, Group III, and the lanthanides of the Periodic Table.

6. A method according to claim 5 wherein said metal from Group II is selected from the group consisting of barium and strontium.

7. A method according to claim 5 wherein said metal from Group III is selected from the group consisting of lanthanum and yttrium.

8. A method according to claim 5 wherein said lanthanide is selected from the group consisting of gadolinium and erbium.

9. A method according to claim 2 further comprising the step of extruding said sol.

10. A method according to claim 2 further comprising the step of casting said sol.

11. A method according to claim 2 further comprising the step of drawing said sol.

12. A method according to claim 9 wherein said sol is extruded into discontinuous fibers.

13. A method according to claim 12 wherein said sol is drawn into continuous fibers.

14. A method for preparing a solid superconducting mixed-metal oxide in a predetermined shape and form, comprising the steps of:
   (a) providing a solution of salts of metals contained in said superconducting mixed metal oxide of a predetermined composition, each of said salts being present in an amount necessary to provide the respective predetermined stoichiometric amount of a metal required in said superconductive mixed metal oxide; the counterions of each metal ion, or the hydrolysis products of said counterions, in said solution of salts being removable from said solution by evaporative methods;
   (b) subjecting said solution to hydrolyzing conditions and removing said counterions and hydrolysis products thereof from said solution by evaporative methods with a substantial portion of the solvent;
   (c) converting said metal ions to a mixed-metal oxide precursor of said superconducting mixed-metal oxide;
   (d) peptizing said mixed-metal oxide precursor to form a viscous polymeric sol;
   (e) forming said viscous polymeric sol into a predetermined shape and form and heat-setting said sol into a flexible, ductile, handleable gel;
   (f) firing said gel in the presence of oxygen at a temperature in the range of about 900–1100° C. and for a period of time sufficient to volatilize any remaining vapors and organic materials to form said solid superconducting mixed metal oxide.

15. A method according to claim 14 further comprising the step of heating said superconducting mixed-metal oxide at one atmosphere or greater in the presence of oxygen at a temperature in the range of about 1000–1100° C.

16. A method according to claim 14 wherein said step of firing said heat-set gel is conducted within a temperature range of about 900–1000° C.

17. A method according to claim 16 wherein said step of firing said heat-set gel is conducted at about 950° C.

18. A castable, extrudable, viscous mixed-metal polymeric composition produced according to the method of any one of claims 9, 10, 11, 12 or 13.

19. A method according to claim 1 or 2 wherein said salts of metals comprise metal carbonates, acetates, hydroxides, formates, or mixtures thereof.

* * * * *